(12) United States Patent
Lasserre et al.

(10) Patent No.: US 11,490,104 B2
(45) Date of Patent: Nov. 1, 2022

(54) METHOD AND APPARATUS FOR IMPROVED SIGNIFICANCE FLAG CODING USING SIMPLE LOCAL PREDICTOR

(71) Applicant: INTERDIGITAL VC HOLDINGS, INC., Wilmington, DE (US)

(72) Inventors: Sebastien Lasserre, Cesson-Sevigne (FR); Pierre Andrivon, Cesson-Sevigne (FR); Philippe Bordes, Cesson-Sevigne (FR)

(73) Assignee: INTERDIGITAL VC HOLDINGS, INC., Wilmington, DE (US)

( * ) Notice: Subject to any disclaimer, the term of this patent is extended or adjusted under 35 U.S.C. 154(b) by 0 days.

(21) Appl. No.: 16/311,414

(22) PCT Filed: Jun. 27, 2017

(86) PCT No.: PCT/EP2017/065859
§ 371 (c)(1),
(2) Date: Dec. 19, 2018

(87) PCT Pub. No.: WO2018/002052
PCT Pub. Date: Jan. 4, 2018

(65) Prior Publication Data
US 2020/0267403 A1   Aug. 20, 2020

(30) Foreign Application Priority Data

Jun. 29, 2016 (EP) ..................................... 16305799

(51) Int. Cl.
*H04N 19/129* (2014.01)
*H04N 19/64* (2014.01)
(Continued)

(52) U.S. Cl.
CPC ............. *H04N 19/46* (2014.11); *G06F 17/18* (2013.01); *H04N 19/129* (2014.11); *H04N 19/647* (2014.11)

(58) Field of Classification Search
CPC ............................. H04N 19/46; H04N 19/129
See application file for complete search history.

(56) References Cited

U.S. PATENT DOCUMENTS 9,135,502 B2 * 9/2015 Haker ................. G06T 19/20
9,167,245 B2 * 10/2015 Lou ..................... H04N 19/91
(Continued)

FOREIGN PATENT DOCUMENTS

AU   2011236109      5/2013
CN   104081773 A    10/2014
(Continued)

OTHER PUBLICATIONS

Nguyen et al: "Significant Coefficient Flag Context Models for Modular Processing", Collaborative Team of Video Coding of ISO/IEC, Jan. 20, 2012.
(Continued)

*Primary Examiner* — Irfan Habib
(74) *Attorney, Agent, or Firm* — Invention Mine LLC

(57) ABSTRACT

Significance flags in advanced video compression systems are coded using contexts adaptive to the last N significance flags coded taken in a scanning order. One embodiment uses the last N significance flags in scanning order as a predictor to determine which of a plurality of sets of significance flag contexts to use for coding subsequent significance flags. A second embodiment uses the last N significance flags in scanning order as a predictor in order to modulate the probability value associated with significance flag contexts that are used to code significance flags for future coding.

20 Claims, 14 Drawing Sheets

(51) Int. Cl.
*H04N 19/46* (2014.01)
*G06F 17/18* (2006.01)

(56) References Cited

U.S. PATENT DOCUMENTS

| | | | |
|---|---|---|---|
| 9,264,706 B2* | 2/2016 | Karczewicz | H03M 7/30 |
| 9,270,988 B2* | 2/2016 | Lou | H04N 19/645 |
| 9,275,078 B2* | 3/2016 | Bhardwaj | G06V 10/443 |
| 9,305,219 B2* | 4/2016 | Ramalingam | G06V 20/586 |
| 9,350,998 B2* | 5/2016 | Joshi | H04N 19/60 |
| 9,379,736 B2* | 6/2016 | Sole Rojals | H04N 19/196 |
| 9,479,780 B2* | 10/2016 | Kung | H04N 19/60 |
| 9,565,435 B2* | 2/2017 | Fang | H04N 19/102 |
| 9,635,358 B2* | 4/2017 | Lou | H04N 19/18 |
| 9,641,835 B2* | 5/2017 | Lou | H04N 19/60 |
| 9,750,399 B2* | 9/2017 | Popovic | A61B 1/313 |
| 9,781,424 B2* | 10/2017 | Ventelae | H04N 19/18 |
| 10,244,261 B2* | 3/2019 | Xu | H04N 19/157 |
| 10,284,851 B2* | 5/2019 | Lou | H04N 19/124 |
| 2008/0219578 A1* | 9/2008 | Lee | H03M 7/4006 382/247 |
| 2009/0002379 A1* | 1/2009 | Baeza | H04N 19/159 345/522 |
| 2012/0026020 A1* | 2/2012 | Korodi | H04N 19/91 341/51 |
| 2012/0082218 A1 | 4/2012 | Misra et al. | |
| 2012/0140813 A1* | 6/2012 | Sole Rojals | H04N 19/18 375/E7.126 |
| 2012/0207213 A1* | 8/2012 | Amon | H04N 19/174 375/E7.026 |
| 2012/0230418 A1 | 9/2012 | Sole Rojals et al. | |
| 2012/0230420 A1* | 9/2012 | Sole Rojals | H04N 19/70 375/240.18 |
| 2012/0328026 A1* | 12/2012 | Sole Rojals | H04N 19/13 375/240.18 |
| 2013/0016789 A1* | 1/2013 | Lou | H04N 19/61 375/240.18 |
| 2013/0058407 A1 | 3/2013 | Sole Rojals et al. | |
| 2013/0128985 A1* | 5/2013 | He | H04N 19/63 375/240.18 |
| 2013/0215969 A1* | 8/2013 | Fang | H04N 19/132 375/240.18 |
| 2016/0000001 A1* | 1/2016 | Bruce | A01B 15/16 172/604 |
| 2016/0350906 A1* | 12/2016 | Meier | G06T 17/10 |
| 2016/0350930 A1* | 12/2016 | Lin | G06N 3/0454 |
| 2016/0353110 A1* | 12/2016 | Zhang | H04N 19/126 |
| 2018/0007376 A1* | 1/2018 | He | H04N 19/61 |
| 2018/0059679 A1* | 3/2018 | Taimouri | G05D 1/0088 |
| 2018/0075602 A1* | 3/2018 | Shen | G06T 7/62 |
| 2018/0096219 A1* | 4/2018 | Socher | G06V 10/82 |
| 2019/0387231 A1* | 12/2019 | Coban | H04N 5/23229 |

FOREIGN PATENT DOCUMENTS

| | | |
|---|---|---|
| CN | 104247420 A | 12/2014 |
| CN | 104272735 A | 1/2015 |
| GB | 2521828 | 7/2015 |
| JP | 2013192118 A | 9/2013 |
| KR | 20150003327 A | 1/2015 |
| WO | WO2013012819 | 1/2013 |
| WO | WO2013064098 | 5/2013 |
| WO | WO2013158642 | 10/2013 |

OTHER PUBLICATIONS

CN104247420A, Translated "Transform coefficient coding" Dec. 24, 2014.
CN104081773A, Translated "Methods and devices for context modeling to enable modular processing" Oct. 1, 2014.
CN104272735A, Translated "Transform Coefficient Coding for Context-Adaptive Binary Entropy Coding of Video" Jan. 7, 2015.

* cited by examiner

| Coefficients | 10 | 0 | -1 | 2 | 0 | 1 | 0 | -1 | 0... |
|---|---|---|---|---|---|---|---|---|---|
| Sig_flag | 1 | 0 | 1 | 1 | 0 | 1 | 0 | 1 | |
| Last_flag | 0 | | 0 | 0 | | 0 | | 1 | |
| Bin 1 | 0 | | 1 | 0 | | 1 | | 1 | |
| Level | 10-2=8 | | | 2-2=0 | | | | | |
| Sign | 0 | | 1 | 0 | | 0 | | 1 | |
PRIOR ART
*FIG. 1*
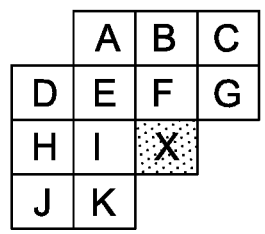
*FIG. 2(A)*
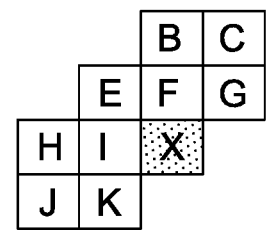
*FIG. 2(B)*
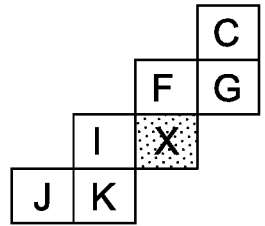
*FIG. 2(C)*
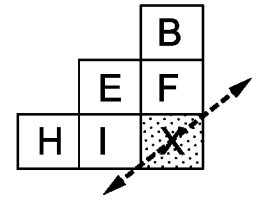
*FIG. 2(D)*
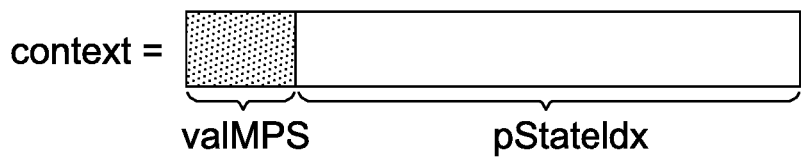
*FIG. 3*

FIG. 8

LUMA

4x4 TU

| 0 | 1 | 2 | 3 | 4 | 5 | 6 | 7 | 8 |
|---|---|---|---|---|---|---|---|---|
| 111 | 111 | 125 | 110 | 110 | 94 | 124 | 108 | 124 | used for DC coeff whatever the TU size

8x8 TU diagonal scan

| 9 | 10 | 11 | 12 | 13 | 14 |
|---|----|----|----|----|----|
| 107 | 125 | 141 | 179 | 153 | 125 | top-left CG    non-top-left CG non diagonal scan

| 9 | 10 | 11 | 12 | 13 | 14 |
|---|----|----|----|----|----|
| 107 | 125 | 141 | 179 | 153 | 125 | top-left CG    non-top-left CG

16x16 TU

| 21 | 22 | 23 | 24 | 25 | 26 |
|----|----|----|----|----|----|
| 107 | 125 | 141 | 179 | 153 | 125 | top-left CG    non-top-left CG

CHROMA

| 27 | 28 | 29 | 30 | 31 | 32 | 33 | 34 | 35 |
|----|----|----|----|----|----|----|----|----|
| 140 | 139 | 182 | 182 | 152 | 136 | 136 | 136 | 153 | used for DC coeff whatever the TU size

| 36 | 37 | 38 |
|----|----|----|
| 136 | 139 | 111 |

| 39 | 40 | 41 |
|----|----|----|
| 136 | 139 | 111 |

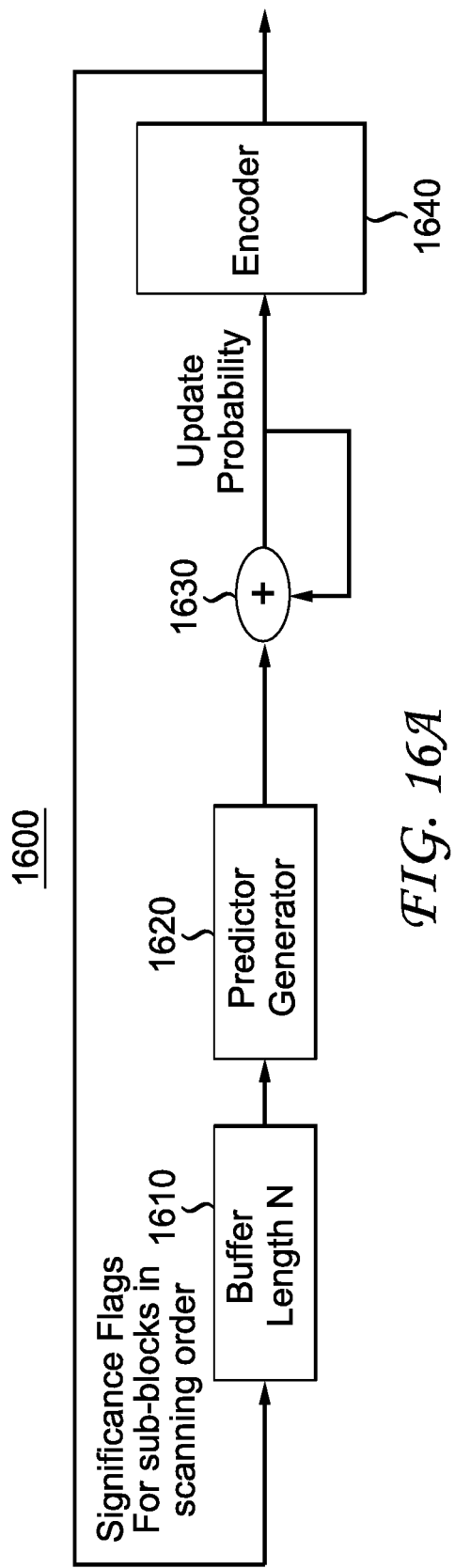
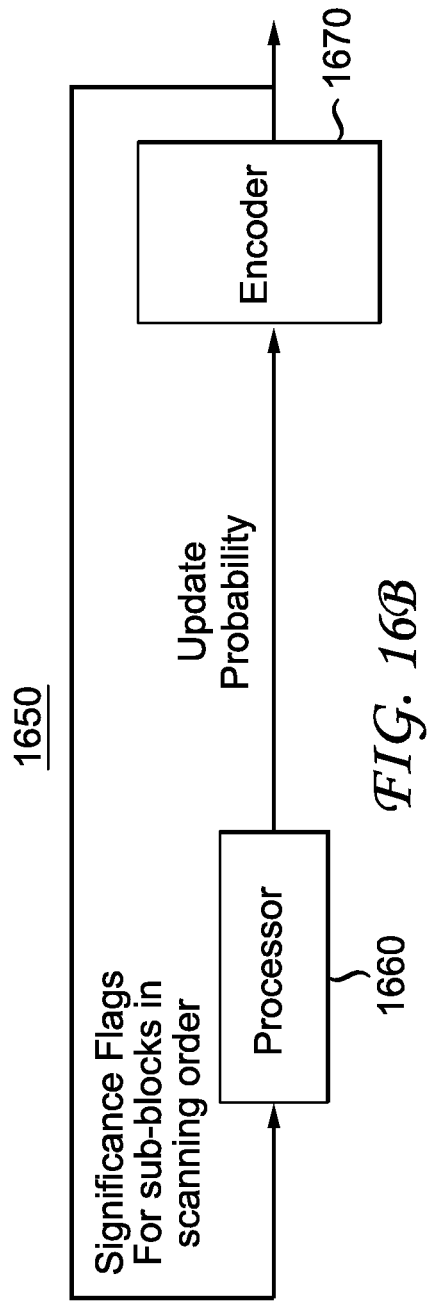
FIG. 16A
FIG. 16B

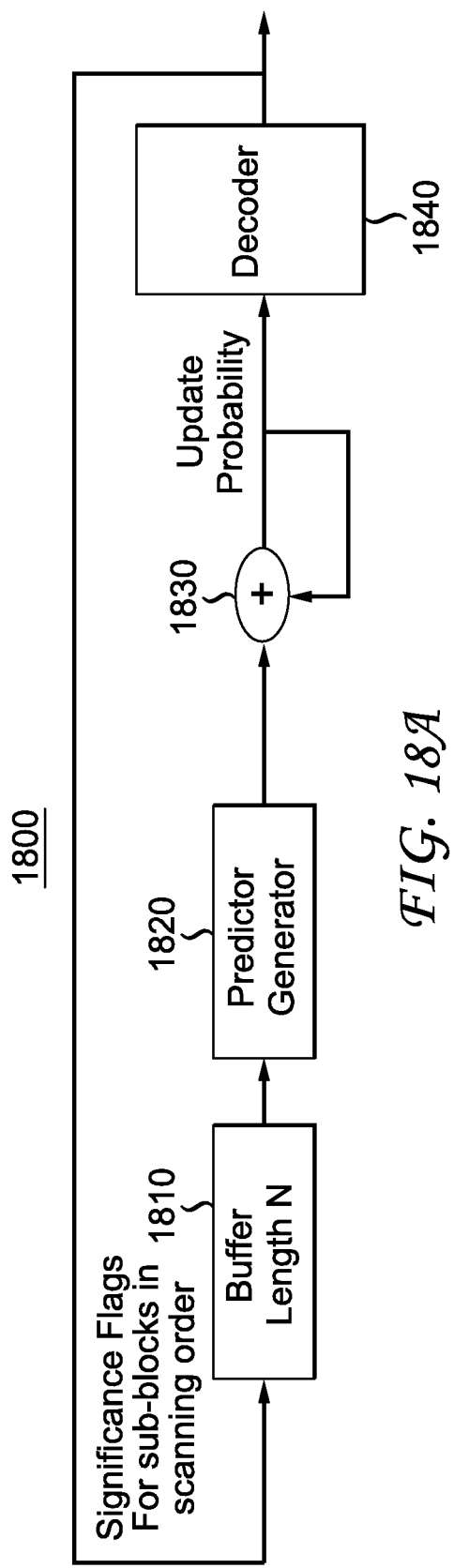
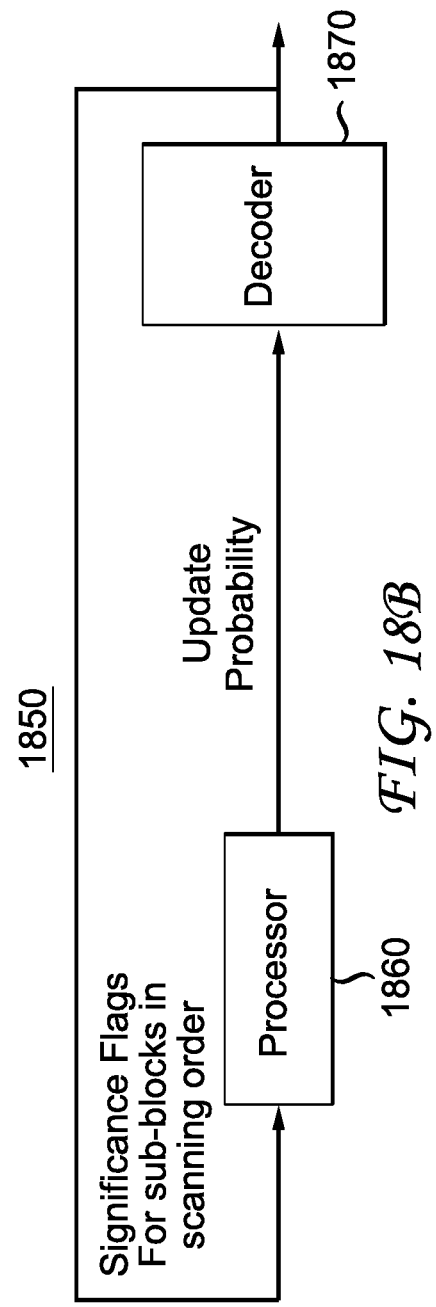
FIG. 18A
FIG. 18B

FIG. 19

Table 2: HEVC contexts for coding the significance flags using CABAC in HEVC
Table 9-29 – Values of initValue for ctxIdx of sig_coeff_flag

| Initialization Variable | ctxIdx of sig_coeff_flag | | | | | | | | | | | | | | | |
|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 |
| initValue | 111 | 111 | 125 | 110 | 110 | 94 | 124 | 108 | 124 | 107 | 125 | 141 | 179 | 153 | 125 | 15 |
| initValue | 16 | 17 | 18 | 19 | 20 | 21 | 22 | 23 | 24 | 25 | 26 | 27 | 28 | 29 | 30 | 107 |
| initValue | 125 | 141 | 179 | 153 | 125 | 107 | 125 | 141 | 179 | 153 | 125 | 140 | 139 | 182 | 182 | 31 |
| initValue | 32 | 33 | 34 | 35 | 36 | 37 | 38 | 39 | 40 | 41 | 42 | 43 | 44 | 45 | 46 | 152 |
| initValue | 136 | 152 | 136 | 153 | 136 | 139 | 111 | 136 | 139 | 111 | 155 | 154 | 139 | 153 | 139 | 47 |
| initValue | 48 | 49 | 50 | 51 | 52 | 53 | 54 | 55 | 56 | 57 | 58 | 59 | 60 | 61 | 62 | 123 |
| initValue | 123 | 63 | 153 | 166 | 183 | 140 | 136 | 153 | 154 | 166 | 183 | 140 | 136 | 153 | 154 | 63 |
| initValue | 64 | 65 | 66 | 67 | 68 | 69 | 70 | 71 | 72 | 73 | 74 | 75 | 76 | 77 | 78 | 166 |
| initValue | 183 | 140 | 136 | 153 | 154 | 170 | 153 | 123 | 123 | 107 | 121 | 107 | 121 | 167 | 151 | 79 |
| initValue | 80 | 81 | 82 | 83 | 84 | 85 | 86 | 87 | 88 | 89 | 90 | 91 | 92 | 93 | 94 | 183 |
| initValue | 140 | 151 | 183 | 140 | 170 | 154 | 139 | 153 | 139 | 123 | 123 | 63 | 124 | 166 | 183 | 95 |
| initValue | 96 | 97 | 98 | 99 | 100 | 101 | 102 | 103 | 104 | 105 | 106 | 107 | 108 | 109 | 110 | 140 |
| initValue | 136 | 153 | 154 | 166 | 183 | 140 | 136 | 153 | 154 | 166 | 183 | 140 | 136 | 153 | 154 | 111 |
| initValue | 112 | 113 | 114 | 115 | 116 | 117 | 118 | 119 | 120 | 121 | 122 | 123 | 124 | 125 | | 170 |
| initValue | 153 | 138 | 138 | 122 | 121 | 122 | 121 | 167 | 151 | 183 | 140 | 151 | 183 | 140 | | |

Legend: for Slice I / for Slice P / for Slice B

METHOD AND APPARATUS FOR IMPROVED SIGNIFICANCE FLAG CODING USING SIMPLE LOCAL PREDICTOR

TECHNICAL FIELD

The present principles relate to video compression and decompression systems generally and, more particularly to significance flag prediction in those systems.

BACKGROUND

Digital video compression systems generally partition digital images into smaller sized units of pixels to compress before transmission. In some compression standards, those smaller sized units are macroblocks and blocks. Blocks are arrays of luminance and chrominance values representative of the pixel values.

Video coding systems also use prediction and block-based transforms to leverage redundancy in intra/inter frame correlation and achieve high compression efficiency. Temporal redundancy is removed from a video sequence by predicting pixel values in a current frame from those in previous frames. Spatial redundancy is removed from a digital video image by predicting pixel values in a current block from those in spatially neighboring blocks that have previously been coded. After transforming the residual values resulting from prediction, the energy of the transform coefficients generally takes up a lower number of coefficients in the frequency domain. These transform coefficients are quantized and scanned in an order that allows them to be entropy coded in some compression systems. Entropy coding makes the coded bit-stream achieve its entropy boundary and further improves the coding efficiency.

An important usage of entropy coding in video coding system is the coding of the quantized transform coefficients of a block, which is the residual data block after intra/inter prediction, block transform, and quantization. For such data, entropy coding tools have been developed, ranging from variable length coding, such as the Huffman coding, to arithmetic coding. Huffman coding uses codes for component symbols, but arithmetic coding can use codes for entire messages.

In the HEVC/H.265 video compression standard, a new tool for coding binary data has been proposed that is based on arithmetic coding, namely the Context-Adaptive Binary Arithmetic Coding (or CABAC). CABAC codes binary symbols. A binary symbol s, which takes value 0 or 1, is coded followed by a probability p to be 1 and 1-p to be 0. This probability is deduced from a context and is adapted after each symbol coding to allow better modeling of probabilities.

CABAC is also the entropy coding method for the quantized transform coefficient block in the International Organization for Standardization/International Electrotechnical Commission (ISO/IEC) Moving Picture Experts Group-4 (MPEG-4) Part 10 Advanced Video Coding (AVC) Standard/International Telecommunication Union, Telecommunication Sector (ITU-T) H.264 Recommendation (hereinafter the "MPEG-4 AVC Standard"). CABAC achieves high coding efficiency, but the non-systematic implementation of the CABAC coding procedure results in two scanning passes being performed to code a data block for AVC. In the first pass, CABAC codes the significance map of the block according to a forward zigzag scanning order. In the second pass, CABAC codes the non-zero values in an inverse zigzag scanning order.

Turning to FIG. 1, an example of CABAC coding is indicated generally by the reference numeral 100. In the significance map coding pass, i.e., the first pass, CABAC uses the sig_flag and last_flag to indicate the positions of the non-zero coefficients.

In the inverse zigzag coding of the non-zero values, two sub-coding processes are used. In the first sub-coding process, a syntax called Bin_1 (i.e., the first bin) is used to indicate whether or not a non-zero coefficient has an absolute value of one. If the non-zero coefficient has an absolute value of one, then Bin_1=1 and the sign of the non-zero coefficient is sent out. Otherwise, Bin_1=0 and the encoding moves to the second sub-coding process. In the second sub-coding process, CABAC codes the coefficients which have an absolute value greater than one, corresponding to Bin_1=0, and then sends out their respective signs.

In addition, the design of CABAC is mainly for smaller block sizes (e.g., 4×4 and 8×8). CABAC turns out to be less efficient for larger blocks (e.g., 16×16, 32×32, and 64×64).

For HEVC, after transforming a transforming a Transform Unit (TU) from the pixel domain to the frequency domain using a transform (such as a Discrete Sine Transform (DST) or Discrete Cosine Transform (DCT)), the transformed coefficients are coded one by one using the following scheme:
- a significance flag signaling whether or not the coefficient is non-zero
- if the significance flag is true, a sign bit
- if the significance flag is true, a "greater than one" (greater1) flag signaling whether or not the coefficient magnitude is strictly higher than one
- if the greater1 flag is true, a "greater than two" (greater2) flag signaling whether or not the coefficient magnitude is strictly higher than two
- if the greater2 flag is true, the remainder of the coefficient magnitude is coded using an expGolomb code.

Significance flags, greater1 flags and greater2 flags are coded using CABAC with dedicated contexts. The following embodiments will focus on increasing the coding efficiency of the significance flag by improving the contextual information of the CABAC.

SUMMARY

These and other drawbacks and disadvantages of the prior art are addressed by the present principles, which are directed to a method and apparatus for improved significance flag coding using simple local predictors.

In two embodiments, methods are provided comprising modifying a significance flag context based on a plurality of the last N significance flags corresponding to a scanning order of a portion of an image, and coding, or decoding, a subsequent significance flag using said modified significance flag context.

In other embodiments, apparatus are provided a processor, configured to modifying a significance flag context based on a plurality of the last N significance flags corresponding to a scanning order of a portion of an image, and an encoder, or decoder that uses the modified significance flag context in encoding, or decoding, video for a portion of an image.

In one particular embodiment, a method is provided comprising determining a significance flag predictor using a vector that is representative of a plurality of the last N significance flags corresponding to a scanning order of a portion of an image. The method further comprises updating a probability value associated with a significance flag context using the significance flag predictor and further comprises coding a subsequent significance flag using the updated probability value associated with the significance flag context.

In another particular embodiment, a second method is provided comprising selecting a first set of significant flag contexts to be used in coding a first significant flag for a portion of an image and further comprising coding each subsequent significant flag in the portion of the image using either the first set of significant flag contexts or a second set of significant flag contexts based on the last N significant flags corresponding to a scanning order of the portion of the image.

In another embodiment, a third method is provided comprising determining a significance flag predictor using a vector that is representative of a plurality of the last N significance flags corresponding to a scanning order of a portion of an image. The method further comprises updating a probability value associated with a significance flag context using the significance flag predictor, and, decoding a subsequent significance flag using the updated probability value associated with the significance flag context.

In yet another embodiment, a fourth method is provided comprising selecting a first set of significant flag contexts to be used in coding a first significant flag for a portion of an image, and, decoding each subsequent significant flag in the portion of the image using either the first set of significant flag contexts or a second set of significant flag contexts based on the last N significant flags corresponding to a scanning order of the portion of the image.

In another embodiment, an apparatus is provided comprising a processor, configured to implement a buffer to store significance flags in a scanning order, circuitry to determine which one of a plurality of significance flag context sets to use, based on the stored significance flags, to encode a next significance flag and a switch to enable the selected significance flag context set to be sent to an encoder; and, an encoder that uses the selected significance flag context set in encoding video for a portion of an image.

In another embodiment, a second apparatus is provided comprising a processor, configured to implement a buffer to store significance flags in a scanning order and to generate a predictor, based on the stored significance flags, to update a probability associated with a significance flag context, and, an encoder that uses the updated probability in encoding video for a portion of an image.

In another embodiment, a third apparatus is provided comprising a processor, configured to implement a buffer to store significance flags in a scanning order, circuitry to determine which one of a plurality of significance flag context sets to use, based on the stored significance flags, to encode a next significance flag and a switch to enable the selected significance flag context set to be sent to an encoder, and, a decoder that uses the selected significance flag context set in decoding video for a portion of an image.

In another embodiment, a fourth apparatus is provided comprising a processor, configured to implement a buffer to store significance flags in a scanning order and to generate a predictor, based on the stored significance flags, to update a probability associated with a significance flag context, and, a decoder that uses the updated probability in decoding video for a portion of an image.

In another embodiment, a non-transitory computer readable storage medium is provided having stored thereon instructions for video encoding or decoding, when executed, implement a method according to any one of the above methods.

In another embodiment, a non-transitory computer readable storage medium is provided having stored thereon a bitstream generated according to any one of the aforementioned encoding embodiments.

In another embodiment, a bitstream generated according to the video encoding method is provided.

BRIEF DESCRIPTION OF THE DRAWINGS

FIG. 1 shows one embodiment of an example of CABAC coding using the present principles.

FIG. 2 shows the neighborhood of significance flags used in prior methods to adapt the context of the current significance flag to be coded.

FIG. 3 shows an example of a context value showing as an 8 bit value.

FIG. 8 shows 27 significance flag contexts for the luma Transform Block and 15 significance flag context for the chroma Transform Block.

FIGS. 16a and 16b show two embodiments of apparatus for encoding significance flags using the present principles.

FIGS. 18a and 18b show two embodiments of apparatus for decoding significance flags using the present principles.

FIG. 19 illustrates Table 2 that includes HEVC contexts for coding significance flags using the present principles.

DETAILED DESCRIPTION

In the past, during the HEVC standardization process, and now during the development of successors to the HEVC standard, it has been identified that more efficient coding performance is achieved by adding a context dependence on the value of the neighboring significance flags. This has not been accepted in the HEVC standard because it increases the number of contexts and adds extra computation and memory-bandwidth consumption in finding the neighboring flags and computing an associated predictor. However, this is again being considered for the next generation of codecs. Examples of tested neighborhoods used for significance flag coding are presented in FIG. 2. FIG. 2 shows the neighborhoods of significance flags (hashed, A to K) used to adapt the context of the current significance flag (X) to be coded used in prior methods.

The proposed solution is a new predictor for the significance flags. This predictor does not depend on the spatial neighbors of the current significance flags to be coded, but instead on criteria such as the last coded significance flag in the scanning order, for example.

A particular implementation is provided that has the following advantages compared to the prior art. The implementation does not require extra memory access to preceding coded significance flags. The computational cost is negligible, and it does not negatively impact the spatial independence of significance flags between Coding Groups.

Two main embodiments are provided for using the new predictor. First, the new predictor is used as a switch between duplicated contexts associated to significance flags. And second, the new predictor is used as a modulation of the probability determined form the current significance flag context.

While the first embodiment shows more coding gains, it requires more contexts. The second embodiment still shows gain compared to HEVC, although less than the first method, but it adds virtually no complexity to HEVC.

Figure 4:
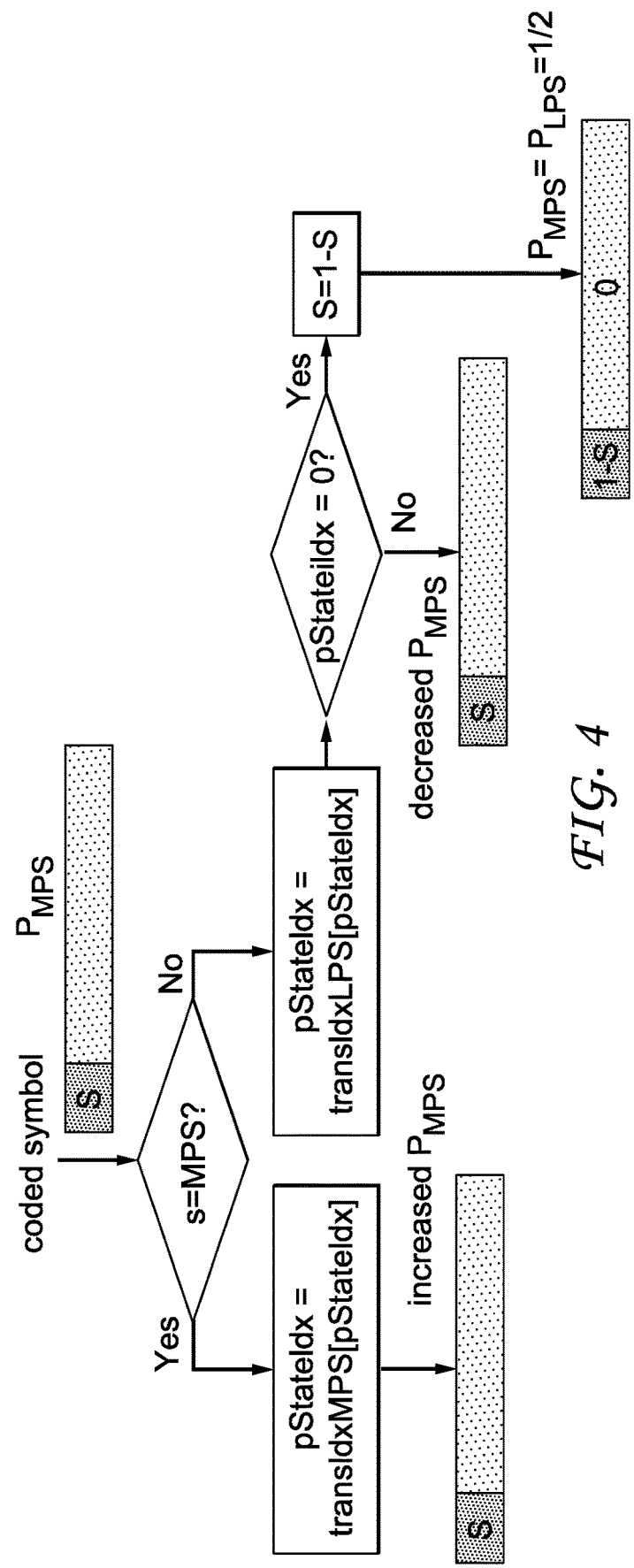
FIG. 4 shows an example of a process for updating of a context value.

In HEVC, a context value is an 8 bit value as in FIG. 3. The leading bit represents the Most Probable Symbol (or MPS) and the next 7 bits represent a probability p' (or state) from which the probability p is deduced. The update of the context value is made following the process shown in FIG. 4, depending on whether or not the coded symbol equals the MPS. The evolution is made through two tables, transIdxMPS if the coded symbol is the MPS, and transIdxLPS if the coded symbol is not the MPS, that is, it is the Least Probable Symbol (LPS). These tables are provided in Table 1 for the entry p', also named pStateIdx.

TABLE 1 tables for the evolution of the context state
Table 9-41 - State transition table

| pStateIdx | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| transIdxLps | 0 | 0 | 1 | 2 | 2 | 4 | 4 | 5 | 6 | 7 | 8 | 9 | 9 | 11 | 11 | 12 |
| transIdxMps | 1 | 2 | 3 | 4 | 5 | 6 | 7 | 8 | 9 | 10 | 11 | 12 | 13 | 14 | 15 | 16 |
| pStateIdx | 16 | 17 | 18 | 19 | 20 | 21 | 22 | 23 | 24 | 25 | 26 | 27 | 28 | 29 | 30 | 31 |
| transIdxLps | 13 | 13 | 15 | 15 | 16 | 16 | 18 | 18 | 19 | 19 | 21 | 21 | 22 | 22 | 23 | 24 |
| transIdxMps | 17 | 18 | 19 | 20 | 21 | 22 | 23 | 24 | 25 | 26 | 27 | 28 | 29 | 30 | 31 | 32 |
| pStateIdx | 32 | 33 | 34 | 35 | 36 | 37 | 38 | 39 | 40 | 41 | 42 | 43 | 44 | 45 | 46 | 47 |
| transIdxLps | 24 | 25 | 26 | 26 | 27 | 27 | 28 | 29 | 29 | 30 | 30 | 30 | 31 | 32 | 32 | 33 |
| transIdxMps | 33 | 34 | 35 | 36 | 37 | 38 | 39 | 40 | 41 | 42 | 43 | 44 | 45 | 46 | 47 | 48 |
| pStateIdx | 48 | 49 | 50 | 51 | 52 | 53 | 54 | 55 | 56 | 57 | 58 | 59 | 60 | 61 | 62 | 63 |
| transIdxLps | 33 | 33 | 34 | 34 | 35 | 35 | 35 | 36 | 36 | 36 | 37 | 37 | 37 | 38 | 38 | 63 |
| transIdxMps | 49 | 50 | 51 | 52 | 53 | 54 | 55 | 56 | 57 | 58 | 59 | 60 | 61 | 62 | 62 | 63 |

The probability $p_{mps}$ of the symbol s to be the MPS is quantized linearly using 8 bits, from 0 to 127. It is deduced from the context value by $$P_{MPS} = (p'+64)/127 = (pStateIdx+64)/127$$

and the probability p of the symbol s to be 1 is deduced obviously from $P_{mps}$ depending on the value of the MPS.

$p = P_{MPS}$ if MPS=1, $p = 1 - p_{mps}$ if MPS=0.

Context-Adaptive coding is a powerful tool that allows to follow dynamically the statistics of the channel to which the symbol belongs. Also, each channel should have its own context to avoid mixing statistics and losing the benefit of the process. This has led to the extensive use of many contexts in HEVC/H.265, up to several hundred, in order to model many channels.

Figure 5:
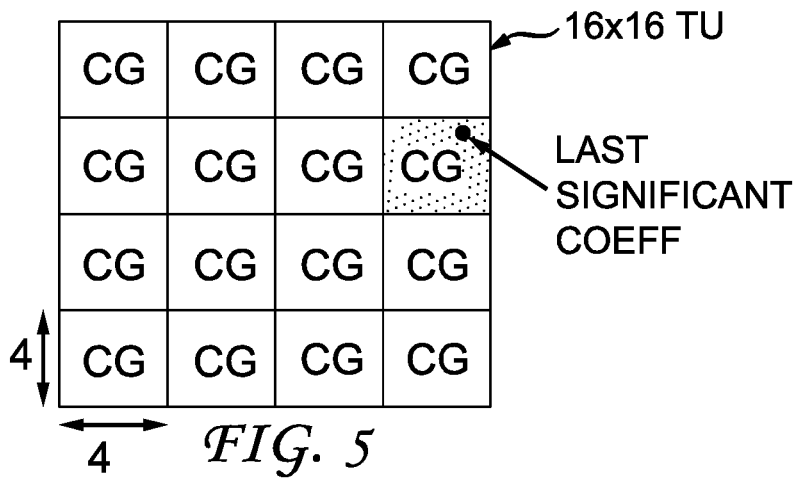
FIG. 5 shows a 16×16 Transform Unit divided into 16 blocks.

In HEVC, a Transform Unit (TU) is divided, for example, into 4×4 blocks (labelled as CG for Coding Group in FIG. 5) that are coded with weak interaction between them. Weak interaction means that coefficient coding between two blocks does not directly interact. For instance, a 16×16 Transform Unit is divided into 16 blocks as shown in FIG. 5.

Figure 6:
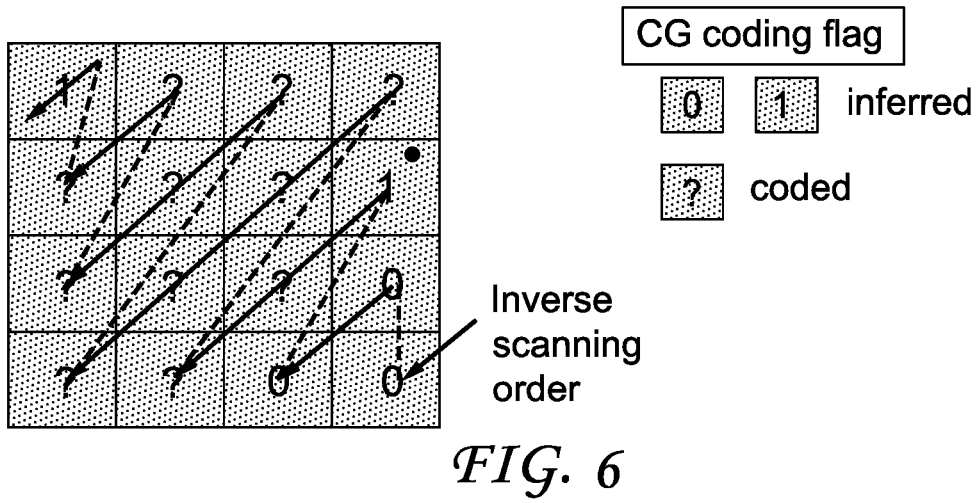
FIG. 6 shows an example of a Transform Unit showing a subset of each of the sub-blocks containing significant coefficients.

The transformed Transform Unit can be scanned in a particular order. Depending on this order, the position of the last significant (non-zero) coefficient is determined and coded in the bitstream. Consequently, only a subset of each of the sub-blocks may contain significant coefficients, as shown in FIG. 6.

Attached to each sub-block (labelled CG in FIG. 5) is a coding flag signaling if there is a significant flag in the sub-block. In FIG. 6, only those sub-blocks with a "?" have a coded flag that is encoded in the bitstream, while those with explicit "1" or "2" in their blocks have their coding flag inferred by the following rules:

Of course, the coding flag of the sub-block containing the last significant coefficient is one Also, the coding flags of the sub-blocks coming after the sub-block containing the last significant coefficient are zero The coding flag of the first (top left) sub-block is automatically inferred to one as it is very likely that there is a significant coefficient at the low frequency position.

This inference may rarely be wrong, thus leading to the coding of 16 significance flags to zero.

Figure 7:
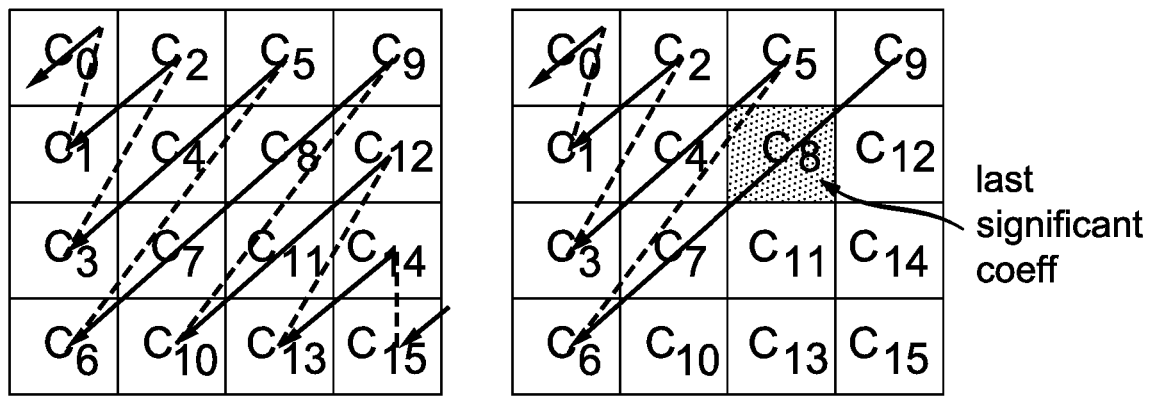
FIG. 7 shows an example of a sub-block and the coefficients are scanned following a given scan order.

Inside a sub-block, the coefficients are scanned following a given scan order, for example, as shown in FIG. 7. The associated significance flags are coded in this order.

For HEVC, significance flags are coded using CABAC with many contexts that depend on such things as slice type (I, P or B), luma or chroma channel, the Transform Block size, neighboring sub-block coding flags, the position of the sub-block in the Transform Block, and the position of the coefficient in the sub-block.

There are 42 contexts for each slice type, and thus a total of 3*42=126 contexts as provided in the HEVC standard document. The relevant table is shown in Table 2 in FIG. 19.

FIG. 8 shows that there are 27 significance flag contexts for the luma Transform Block and 15 significance flag context for the chroma Transform Block. The DC coefficient has its own context, index 0 for luma and index 27 for chroma. These contexts depend on the Transform Block size (4×4, 8×8 or 16×16 and larger). For 8×8 or larger luma Transform Blocks, the context index also depends on the position of the sub-block (top-left or otherwise) in the Transform Block. The structure of the contexts differ depending on whether the Transform Block size is 4×4, as detailed below.

Figure 9:
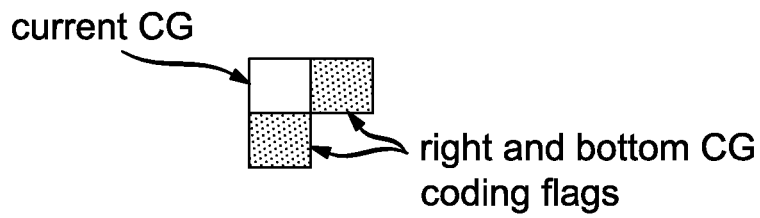
FIG. 9 shows that 4×4 Transport Blocks, regardless of color channel, with context indices depending only on the position of the coefficient in the unique sub-block of the Transform Unit.

For 4×4 Transport Blocks, regardless of color channel, the context indices depend only on the position of the coefficient in the unique sub-block of the Transform Unit. This is shown in FIG. 9 for the luma 4×4 Transform Block, and this is similar for chroma 4×4 Transform Block by adding a 27 value to the indices.

For Transform Block sizes equal or larger than 8×8, one notices from FIG. 8 that there is one context to be chosen among three contexts. Applying a coherent shift depending on the Transform Block size, the sub-block position and the color channel, one may label these indices 0, 1 and 2 without ambiguity.

Figure 10:
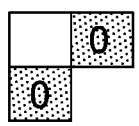
FIG. 10 shows bottom and right sub-block coding flags, and the position of the coefficient inside the current sub-block.
Figure 10:
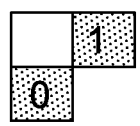
Figure 10:
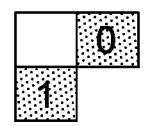
Figure 10:
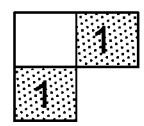

FIG. 10 depicts that this label depends on the value of the bottom and right sub-block coding flags, and the position of the coefficient inside the current sub-block.

The embodiments presented herein do not change the above-described methods used to determine the context index. Instead, these embodiments provide extra information via a new predictor to be used to refine a probability attached to the context, or to choose between multiple significance flag context sets. The aforementioned probability represents the probability of the current significance flag to be true. In either case, the predictor, for updating a probability or for the decision as to which set of significance flag contexts to use, is determined based on past significance flags, and particularly using past significance flags according to a scanning order.

Some examples are now shown to demonstrate methods of constructing the new predictor. Two embodiments will describe use of this predictor. In order to synchronize a decoder with an encoder, the predictor proposed herein is generated in both an encoder and a decoder.

The proposed predictor is a circular buffer B of size N storing the N values of the last N coded, or decoded, significant flags. The circular buffer is filled as follows:
1. The initial state is all N entries set to zero
2. Starting from the last coefficient and going to the DC coefficient following the reverse scan order, one proceeds with the coding, or decoding, of significance flags as follows:
   a. obtain the scanning position pos of the current significance flag
   b. encode, or decode, the current significance flag f using the circular buffer as predictor
   c. update the circular buffer by B[pos mod N]=f In a preferred variant, the size of the buffer is N=4 such that (I mod N) is simply computed by using a binary mask and the buffer is updated by B[pos&3]=f.

In HEVC, only the update of the circular buffer has to be added to the encoding, or decoding, process, such that the computational cost to determine the predictor state is virtually zero. One should note that "modulo" is a complex operation, but using a value of N that is a power of two allows the modulo operation to be implemented using a mask, making the modulo operation virtually costless.

In a first embodiment, one of a plurality of sets of significant flag contexts are chosen based on the contents of the significance flag buffer, which stores the last N significance flags in a scanning order. For example, in HEVC the 42 significant flag contexts are duplicated to get two sets of 42 contexts. One of the duplicated sets is for a "normal" regime and another set for a "full" regime in which most of the significant flags are one. The switch between the two sets is driven by a 4 element circular buffer predictor as previously described. The procedure is that for each sub-block, the "normal" set is selected for coding of the first significant flag in the sub-block. Then for the following significant flags, if the number of "1 s" (trues) in the circular buffer is greater than or equal to 3, then the "full" set is selected. If the number of "1 s" (trues) in the circular buffer is less than or equal to 1, then the "normal" set is selected. If the number of "1 s" (trues) in the circular buffer is equal to 2, then the same set as used for the preceding significant flag is selected.

This example embodiment uses a circular buffer length of 4 and determines which context set to use based on the number of 1s in the circular buffer. These values are only used as an example here and do not limit the scope of the idea. A generalized rule for this embodiment is that a switch between M different sets of contexts depends on the number of 1s in the N length buffer. The exact number of 1s needed for switching between the M sets can be different than this example, or the decision can be some function of the contents of the buffer, for example, weighting the different positions in the buffer with weights.

Figure 11:
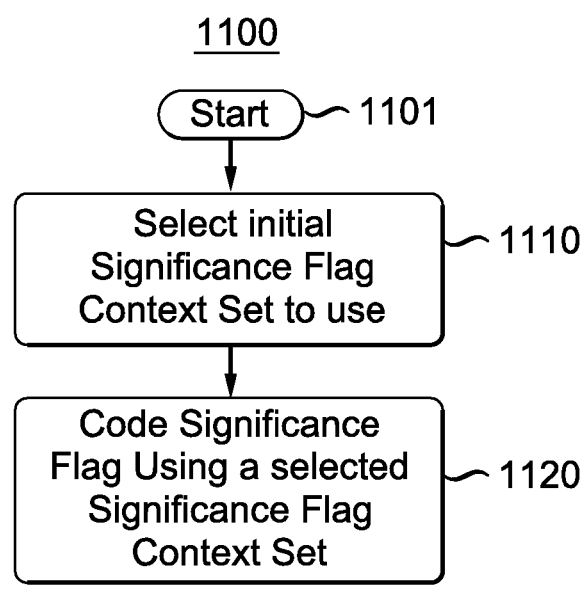
FIG. 11 shows one embodiment of a method for encoding significance flags using the present principles.

FIG. 11 shows one embodiment of a method 1100 for encoding significance flags using the present principles. The method commences at block 1101 and proceeds to block 1110 for selecting an initial significance flag context set to use for coding a first significance flag in a coding block or sub-block. The method proceeds from block 1110 to block 1120 in which subsequent significant flags are coded using a selected significance flag context set chosen from among a plurality of significance flag context sets using the last N significance flags in a scanning order. The determination can be based on the number of 1s of the last N significance flags in a scanning order, or some other function of those significance flags.

Figure 12A:
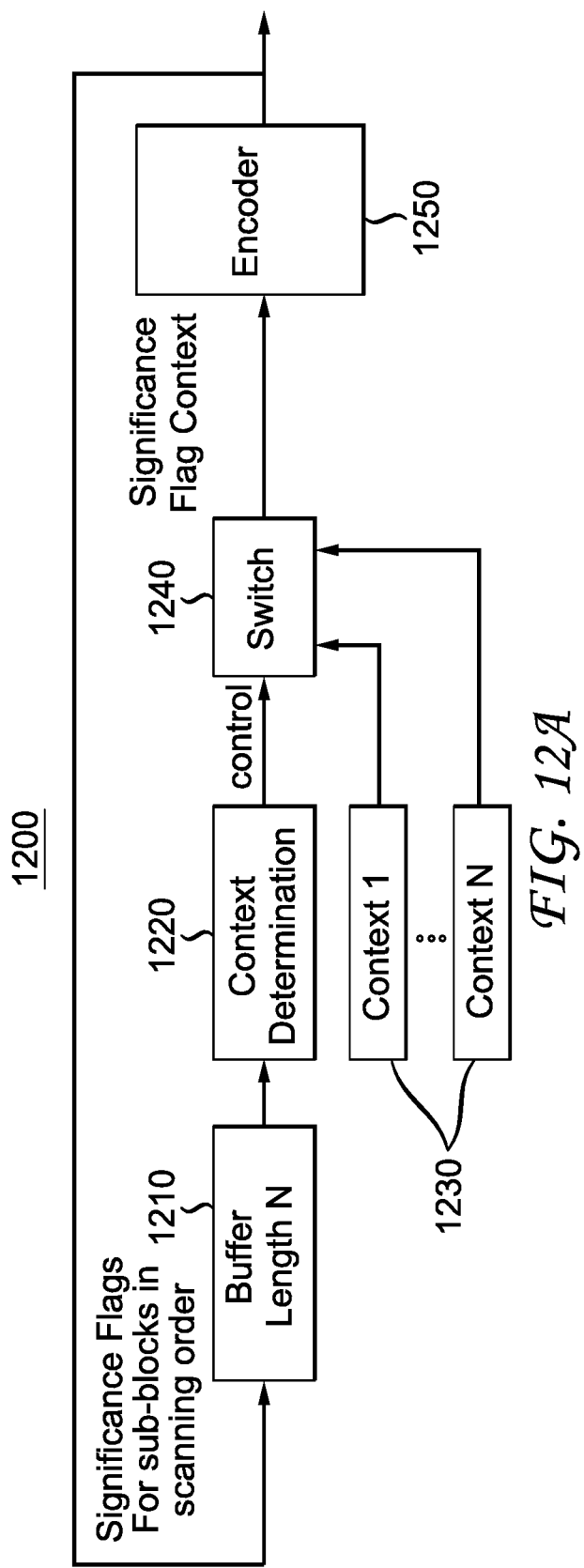
FIGS. 12a and 12b show two embodiments of apparatus for encoding significance flags using the present principles.

FIG. 12 shows two embodiments of apparatus for encoding significance flags using the present principles. In the apparatus 1200 of FIG. 12a, Buffer 1210 receives on its input significance flags for sub-blocks in scanning order from Encoder 1250. Buffer 1210 stores the last N significance flags from the scanning order. The output of buffer 1210 is in signal connectivity with the input of a context determination circuit 1220 that determines, from the significance flags stored in Buffer 1210, a control signal to be used to determine which of a plurality of significance flag context sets should be used to code the next significance flag. The control signal can be based on the number of 1s in the last N significance flags in a scanning order, or on some other function of those significance flags.

The control signal is output from circuit 1220 to a first input of Switch 1240. Switch 1240 also receives N inputs, representing significance flag context sets 1 through N 1230, on its input ports. The control signal from circuit 1220 selects one of the N sets of significance flag contexts and outputs the selected significance flag context to encoder 1250 on an output port. Encoder 1250 then uses the selected significance flag context set to encode subsequent significance flags for additional sub-blocks.

Figure 12B:
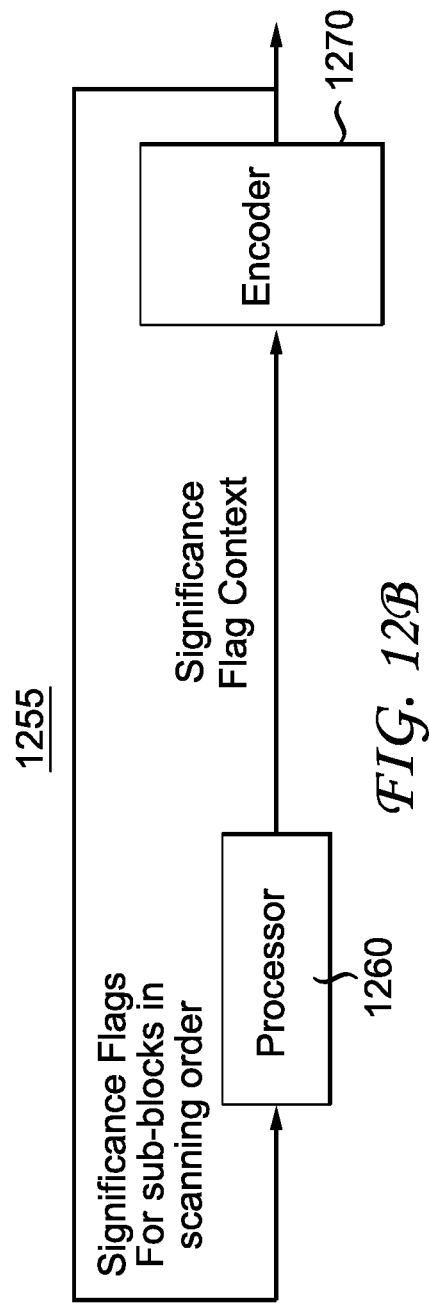

FIG. 12*b* shows an embodiment of an apparatus 1255 for encoding significance flags using the present principles using a processor. Processor 1260 receives on its input significance flags for sub-blocks in scanning order from Encoder 1270. Processor 1260 determines which of a number of stored significance flag context sets to output on an output port to an input of Encoder 1270 for subsequent coding of additional significance flags for future sub-blocks. Processor 1260 can base this determination on the number of 1s in the last N significance flags in a scanning order, or on some other function of those significance flags.

Figure 13:
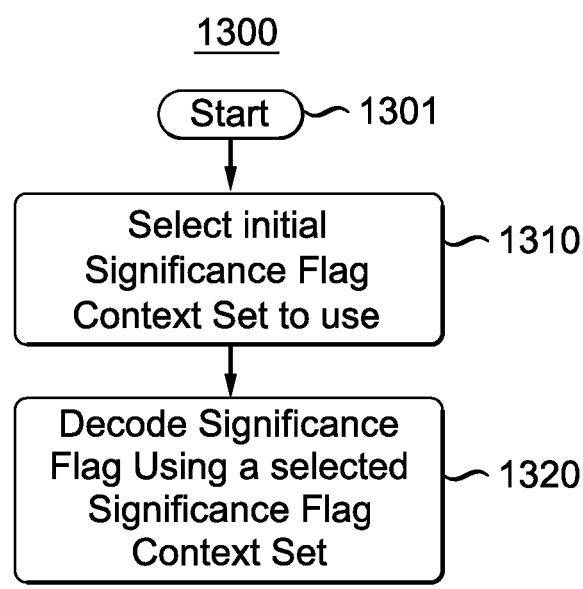
FIG. 13 shows one embodiment of a method for decoding significance flags using the present principles.

FIG. 13 shows one embodiment of a method 1300 for decoding significance flags using the present principles. The method commences at block 1101 and proceeds to block 1110 for selecting an initial significance flag context set to use for decoding a first significance flag in a coding block or sub-block. The method proceeds from block 1110 to block 1120 in which subsequent significant flags are decoded using a selected significance flag context set chosen from among a plurality of significance flag context sets using the last N significance flags in a scanning order. The determination can be based on the number of 1s of the last N significance flags, or some other function of those significance flags.

Figure 14A:
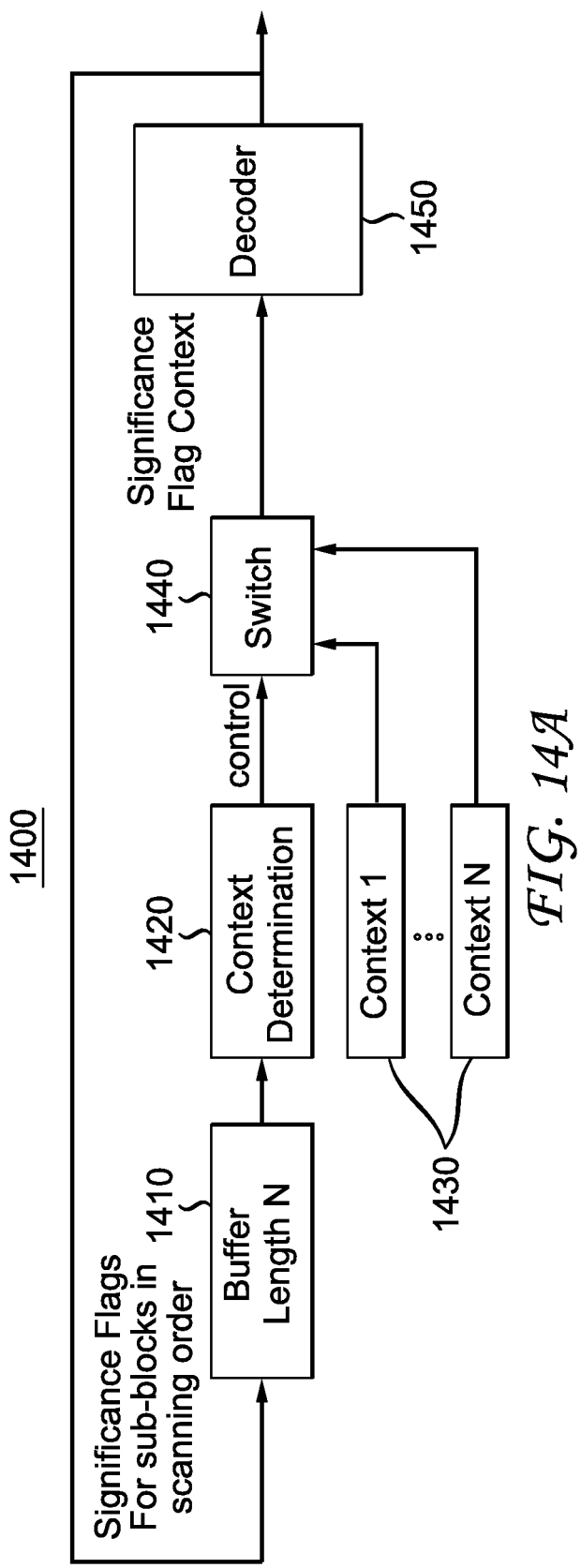
FIGS. 14a and 14b show two embodiments of apparatus for decoding significance flags using the present principles.

FIG. 14 shows two embodiments of apparatus for decoding significance flags using the present principles. In the apparatus 1400 of FIG. 14*a*, Buffer 1410 receives on its input significance flags for sub-blocks in scanning order from Decoder 1450. Buffer 1410 stores the last N significance flags from the scanning order. The output of buffer 1410 is in signal connectivity with the input of a context determination circuit 1420 that determines, from the significance flags stored in Buffer 1410, a control signal to be used to determine which of a plurality of significance flag context sets should be used to decode the next significance flag. The control signal can be based on the number of 1s in the last N significance flags in a scanning order, or on some other function of those significance flags. The control signal is output from circuit 1420 to a first input of Switch 1440. Switch 1440 also receives N inputs, representing significance flag context sets 1 through N 1430, on its input ports. The control signal from circuit 1420 selects one of the N sets of significance flag contexts and outputs the selected significance flag context to Decoder 1450 on an output port. Decoder 1450 then uses the selected significance flag context set to decode subsequent significance flags for additional sub-blocks.

Figure 14B:
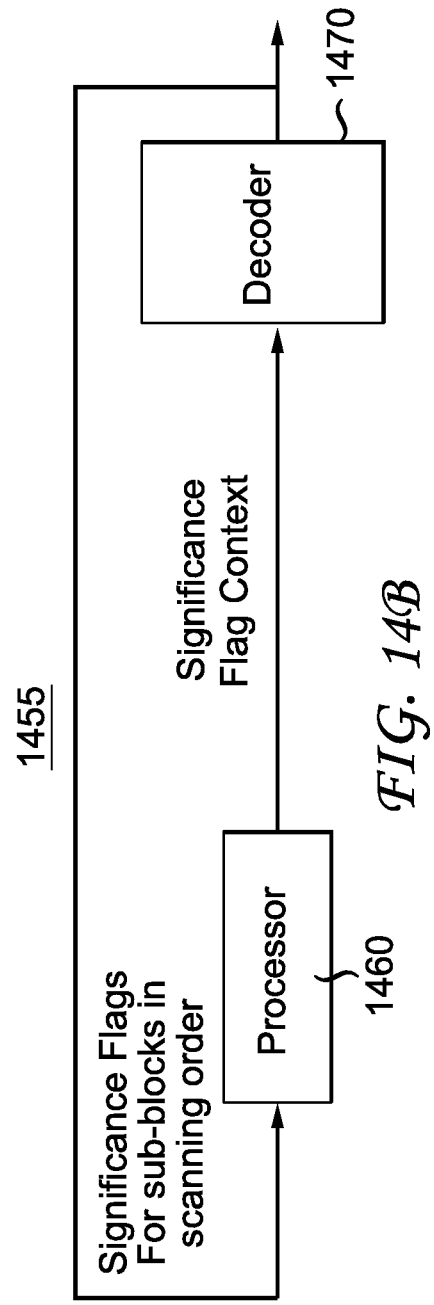

FIG. 14*b* shows an embodiment of an apparatus 1455 for decoding significance flags using the present principles using a processor. Processor 1460 receives on its input significance flags for sub-blocks in scanning order from Decoder 1470. Processor 1460 determines which of a number of stored significance flag context sets to output on an output port to an input of Decoder 1470 for subsequent decoding of additional significance flags for future sub-blocks. Processor 1460 can base this determination on the number of 1s in the last N significance flags in a scanning order, or on some other function of those significance flags.

A second embodiment is an application of the proposed predictor to modulate the context probability. This embodiment is a specific variation of a previously disclosed idea in European Application 16305554.4, Context with Adaptive Probability for Video Coding. That application discloses the idea is of modulating the probability attached to a context by some information that subdivides the channel to which the context is attached into sub-channels that share this common context.

Here, in the second embodiment, the probability p that the significant flag is 1 of the significant flag context is modified into $p_m$ depending on the predictor as follows:

$$p_m = p\Delta$$

where $\Delta$ is a modulation value that depends on the predictor state.

In a variation of this second embodiment, the modulation value $\Delta$ is computed by the following process. For each sub-block, an initial value $\Delta=0$ is selected for the coding of the first significant flag. Then, for the following significant flags, if the number of "1s" in the circular buffer is greater than or equal to 3, then the value $\Delta=\Delta_p$ is selected. If the number of "1s" in the circular buffer is less than or equal to 1, then the value $\Delta=\Delta_n$ is selected. And, if the number of "1s" in the circular buffer is equal to 2, then the value $\Delta=0$ is selected. The values $\Delta_p$ and $\Delta_n$ are two parameters that are, respectively, positive and negative. This variation of the second embodiment is easily generalized by stating that the modulation value is determined by the number of "1 s" in the circular buffer.

In another variation, the modulation value is a weighted sum of the circular buffer entries:

$$\Delta = \sum_{k=0}^{N-1} w_k B[k]$$

where the $w_k$'s are weights that can depend on the scanning position.

Figure 15:
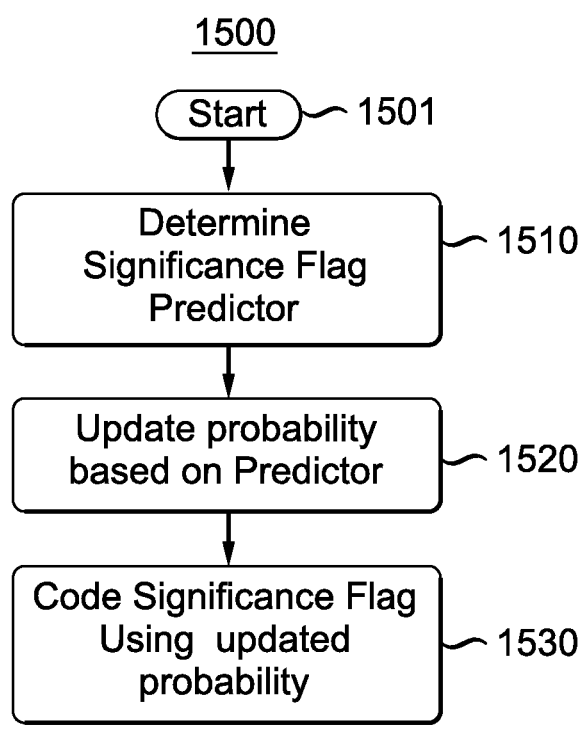
FIG. 15 shows one embodiment of a method for encoding significance flags using the present principles.

FIG. 15 shows one embodiment of a method 1500 for encoding significance flags using the present principles. The method commences at block 1501 and proceeds to block 1510 for determining a significance flag predictor from previous significance flags in a scanning order. The predictor can be determined by counting the number of 1s in the last N significance flags in a scanning order, or on some other function of those significance flags. Control proceeds from block 1510 to block 1520 for updating a probability associated with a significance flag context based on the determined predictor from block 1510. That probability can be updated, for example, by adding a predictor to the current predictor, either a default value or the last predictor value used. For example, with a 4 element buffer storing the last 4 significant flags in a coding order, the predictor for the next significant flag context probability can be determined by selecting a positive predictor if the number of 1s in the buffer at that time is greater than or equal to 3, selecting a negative predictor if the number of 1s in the buffer at that time is less than or equal to 1, and not adding any predictor to the significant flag context probability if the number of 1s in the buffer is two. Control then proceeds from block 1520 to block 1530 for coding a next significance flag using the updated probability calculated in block 1520.

FIG. 16 shows two embodiments of apparatus for encoding significance flags using the present principles. FIG. 16*a* shows an apparatus 1600 comprising a Buffer of length N that stores significance flags for sub-blocks in a scanning order that are being encoded by Encoder 1640. The significance flags are input to an input port of Buffer 1610 and are sent from an output port of Buffer 1610 to an input of Predictor Generator circuit 1620, which is in signal connectivity with Buffer 1610 and receives the significance flags on an input port of Predictor Generator circuit 1620. Predictor generator circuit 1620 can form a probability prediction by counting the number of 1s in the last N significance flags in a scanning order, or on some other function of those significance flags. The probability prediction is output on an output port of Predictor Generator 1620 to a first input port of Adder 1630, which adds the probability prediction to the previous version of the probability on a second input port to Adder 1630. The output of Adder 1630 is in signal connectivity with an input port of Encoder 1640, which uses the updated probability associated with the significance flag context to be used for the next coded significance flag, to be output from Encoder 1640.

FIG. 16*b* shows a similar embodiment as in FIG. 16*a*, but the apparatus 1650 comprises Processor 1660 which performs the functions of Buffer 1610, Predictor Generator circuit 1620 and Adder 1630 in FIG. 16*b*. Encoder 1670 then uses the updated probability, output from Processor 1660 and which is associated with the significance flag context to be used for the next coded significance flag to be output from Encoder 1670.

Figure 17:
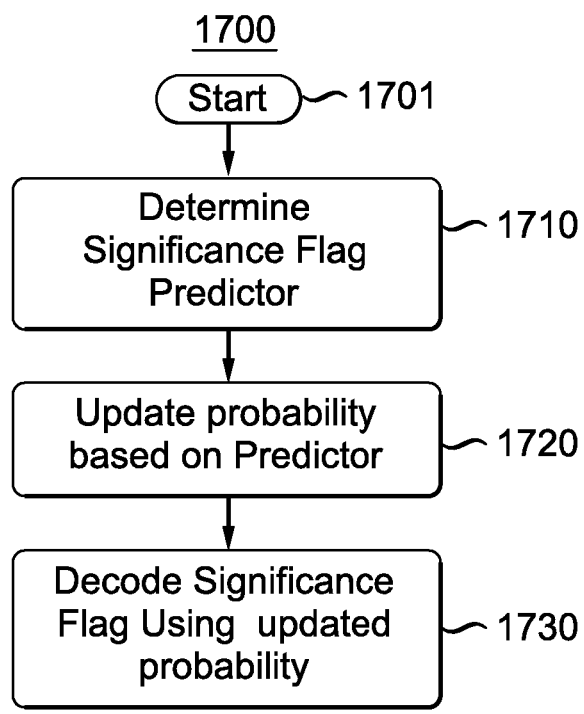
FIG. 17 shows one embodiment of a method for decoding significance flags using the present principles.

FIG. 17 shows one embodiment of a method 1700 for decoding significance flags using the present principles. The method commences at block 1701 and proceeds to block 1710 for determining a significance flag predictor from previous significance flags in a scanning order. The predictor can be determined by counting the number of 1s in the last N significance flags in a scanning order, or on some other function of those significance flags. Control proceeds from block 1710 to block 1720 for updating a probability associated with a significance flag context based on the determined predictor from block 1710. That probability can be updated, for example, by adding a predictor to the current predictor, either a default value or the last predictor value used. For example, with a 4 element buffer storing the last 4 significant flags in a coding order, the predictor for the next significant flag context probability can be determined by selecting a positive predictor if the number of 1s in the buffer at that time is greater than or equal to 3, selecting a negative predictor if the number of 1s in the buffer at that time is less than or equal to 1, and not adding any predictor to the significant flag context probability if the number of 1 s in the buffer is two. Control then proceeds from block 1720 to block 1730 for decoding a next significance flag using the updated probability calculated in block 1720.

FIG. 18 shows two embodiments of apparatus for decoding significance flags using the present principles. FIG. 18*a* shows an apparatus 1800 comprising a Buffer of length N that stores significance flags for sub-blocks in a scanning order that are being decoded by Decoder 1840. The significance flags are input to an input port of Buffer 1810 and are sent from an output port of Buffer 1810 to an input of Predictor Generator circuit 1820, which is in signal connectivity with Buffer 1810 and receives the significance flags on an input port of Predictor Generator circuit 1820. Predictor generator circuit 1820 can form a probability prediction by counting the number of 1s in the last N significance flags in a scanning order, or on some other function of those significance flags. The probability prediction is output on an output port of Predictor Generator 1820 to a first input port of Adder 1830, which adds the probability prediction to the previous version of the probability on a second input port to Adder 1830. The output of Adder 1830 is in signal connectivity with an input port of Decoder 1840, which uses the updated probability associated with the significance flag context to be used for the next decoded significance flag, to be output from Decoder 1640.

FIG. 18*b* shows a similar embodiment as in FIG. 18*a*, but the apparatus 1850 comprises Processor 1860 which performs the functions of Buffer 1810, Predictor Generator circuit 1820 and Adder 1830 in FIG. 18*b*. Encoder 1870 then uses the updated probability, output from Processor 1860 and which is associated with the significance flag context to be used for the next decoded significance flag to be output from Encoder 1870.

In these two embodiments and their variations, some number of preceding significant flags used to predict the current significant flag are not spatial neighbors, but are the last N coded significance flags. By last it is understood to be relative to the scanning order of the coefficients. A variant with an N-circular buffer is provided with very low complexity for values of N that are a power of two.

Particular advantages of these embodiments is that they improve the compression efficiency of video compression techniques, such as HEVC successors, without adding significant complexity to either an encoder or a decoder.

The aforementioned embodiments can be implemented in Set Top Boxes (STBs), modems, gateways or other devices that perform video encoding or decoding.

The functions of the various elements shown in the figures can be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor ("DSP") hardware, read-only memory ("ROM") for storing software, random access memory ("RAM"), and non-volatile storage.

Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

The present description illustrates the present principles. It will thus be appreciated that those skilled in the art will be able to devise various arrangements that, although not explicitly described or shown herein, embody the present principles and are included within its scope.

All examples and conditional language recited herein are intended for pedagogical purposes to aid the reader in understanding the present principles and the concepts contributed by the inventor(s) to furthering the art, and are to be construed as being without limitation to such specifically recited examples and conditions.

Moreover, all statements herein reciting principles, aspects, and embodiments of the present principles, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that the block diagrams presented herein represent conceptual views of illustrative circuitry embodying the present principles. Similarly, it will be appreciated that any flow charts, flow diagrams, state transition diagrams, pseudocode, and the like represent various processes which may be substantially represented in computer readable media and so executed by a computer or processor, whether or not such computer or processor is explicitly shown.

In the claims hereof, any element expressed as a means for performing a specified function is intended to encompass any way of performing that function including, for example, a) a combination of circuit elements that performs that function or b) software in any form, including, therefore, firmware, microcode or the like, combined with appropriate circuitry for executing that software to perform the function. The present principles as defined by such claims reside in the fact that the functionalities provided by the various recited means are combined and brought together in the manner which the claims call for. It is thus regarded that any means that can provide those functionalities are equivalent to those shown herein.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

The invention claimed is:

1. A method for video encoding comprising:
   modifying a significance flag Context-Adaptive Binary Arithmetic Coding (CABAC) context of a significance flag of a coefficient of a portion of an image, the significance flag signalling whether or not the coefficient is non-zero; and
   encoding the significance flag using the modified significance flag CABAC context, wherein the modifying uses N last encoded significance flags according to a scanning order of coefficients of the portion of the image to modify the significance flag CABAC context based on a number of significance flags having a value equal to one in the N last encoded significance flags.

2. The method of claim 1, wherein the significance flag CABAC context is modified by updating a probability that the significance flag is representative of a non-zero coefficient associated with the significance flag CABAC context.

3. The method of claim 1, wherein the significance flag CABAC context is modified by choosing one of a plurality of sets of significance flag CABAC contexts for encoding the significance flags.

4. The method of claim 1, wherein information representative of the N last encoded significance flags according to the scanning order of coefficients of the portion of the image is stored in a circular buffer.

5. A method for video decoding comprising:
   modifying a significance flag Context-Adaptive Binary Arithmetic Coding (CABAC) context of a significance flag of a coefficient of a portion of an image, the significance flag signalling whether or not the coefficient is non-zero; and
   decoding the significance flag using the modified significance flag CABAC, wherein the modifying uses N last decoded significance flags according to a scanning order of coefficients of the portion of the image to modify the significance flag CABAC context based on a number of significance flags having a value equal to one in the N last decoded significance flags.

6. The method of claim 5, wherein the significance flag CABAC context is modified by updating a probability that the significance flag is representative of a non-zero coefficient associated with the significance flag CABAC context.

7. The method of claim 5, wherein the significance flag CABAC context is modified by choosing one of a plurality of sets of significance flag CABAC contexts to use for decoding the significance flag.

8. The method of claim 5, wherein information representative of the N last decoded significance flags according to the scanning order of coefficients of the portion of the image is stored in a circular buffer.

9. An apparatus for video encoding comprising at least one processor and at least one memory having stored instructions operative, when executed by the at least one processor, to cause the apparatus to:
   modify a significance flag Context-Adaptive Binary Arithmetic Coding (CABAC) context of a significance flag of a coefficient of a portion of an image, the significance flag signalling whether or not the coefficient is non-zero; and
   encode the significance flag using a selected significance flag CABAC context, wherein the modifying uses N last encoded significance flags according to a scanning order of coefficients of the portion of the image to modify the significance flag CABAC context based on a number of significance flags having a value equal to one in the N last encoded significance flags.

10. The apparatus of claim 9, wherein the significance flag CABAC context is modified by updating a probability that the significance flag is representative of a non-zero coefficient associated with the significance flag CABAC context.

11. The apparatus of claim 9, wherein the significance flag CABAC context is modified by choosing one of a plurality of sets of significance flag CABAC contexts to use for encoding the significance flag.

12. The apparatus of claim 9, wherein information representative of the N last encoded significance flags according to the scanning order of coefficients of the portion of the image is stored in a circular buffer.

13. An apparatus for video decoding comprising at least one processor and at least one memory having stored instructions operative, when executed by the at least one processor, to cause the apparatus to:
   modifying a significance flag Context-Adaptive Binary Arithmetic Coding (CABAC) context of a significance flag of a coefficient of a portion of an image, the significance flag signalling whether or not the coefficient is non-zero; and
   decode the significance flag using the modified significance flag CABAC context, wherein the modifying uses N last decoded significance flags according to a scanning order of coefficients of the portion of the image to modify the significance flag CABAC context based on a number of significance flags having a value equal to one in the N last decoded significance flags.

14. The apparatus of claim 13, wherein the significance flag CABAC context is modified by updating a probability that the significance flag is representative of a non-zero coefficient associated with the significance flag CABAC context.

15. The apparatus of claim 13, wherein the significance flag CABAC context is modified by choosing one of a plurality of sets of significance flag CABAC contexts to use for decoding the significance flag.

16. The apparatus of claim 13, wherein information representative of the N last decoded significance flags according to the scanning order of coefficients of the portion of the image is stored in a circular buffer.

17. A non-transitory computer-readable storage medium having stored instructions that are operative, when executed by a processor, to cause the processor to perform:
- modifying a significance flag Context-Adaptive Binary Arithmetic Coding (CABAC) context of a significance flag of a coefficient of a portion of an image, the significance flag signalling whether or not the coefficient is non-zero; and
- encoding the significance flag using the modified significance flag CABAC context, wherein the modifying uses N last encoded significance flags according to a scanning order of coefficients of the portion of image to modify the significance flag CABAC context based on a number of significance flags having a value equal to one in the N last encoded significance flags.

18. The non-transitory computer-readable storage medium of claim 17, wherein the significance flag CABAC context is modified by updating a probability that the significance flag is representative of a non-zero coefficient associated with the significance flag CABAC context.

19. A non-transitory computer-readable storage medium having stored instructions that are operative, when executed by a processor, to cause the processor to perform:
- modify a significance flag Context-Adaptive Binary Arithmetic Coding (CABAC) context of a significance flag of a coefficient of a portion of an image, the significance flag signalling whether or not the coefficient is non-zero; and
- decoding the significance flag using the modified significance flag CABAC context, wherein the modifying uses N last decoded significance flags according to a scanning order of coefficients of the portion of the image to modify the significance flag CABAC context based on a number of significance flags having a value equal to one in the N last decoded significance flags.

20. The non-transitory computer-readable storage medium of claim 19, wherein the significance flag CABAC context is modified by updating a probability that the significance flag is representative of a non-zero coefficient associated with the significance flag CABAC context.

* * * * *